United States Patent
Lu et al.

(10) Patent No.: US 9,496,314 B1
(45) Date of Patent: Nov. 15, 2016

(54) SHARED SOURCE LINE MAGNETIC TUNNEL JUNCTION (MTJ) BIT CELLS EMPLOYING UNIFORM MTJ CONNECTION PATTERNS FOR REDUCED AREA

(71) Applicant: QUALCOMM Incorporated, San Diego, CA (US)

(72) Inventors: Yu Lu, San Diego, CA (US); Xiaochun Zhu, San Diego, CA (US); Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/853,116

(22) Filed: Sep. 14, 2015

(51) Int. Cl.
| | |
|---|---|
| *H01L 29/66* | (2006.01) |
| *H01L 27/22* | (2006.01) |
| *H01L 43/02* | (2006.01) |
| *H01L 43/08* | (2006.01) |
| *H01L 43/12* | (2006.01) |
| *H01L 21/8234* | (2006.01) |

(52) U.S. Cl.
CPC ..... *H01L 27/228* (2013.01); *H01L 21/823475* (2013.01); *H01L 43/02* (2013.01); *H01L 43/08* (2013.01); *H01L 43/12* (2013.01)

(58) Field of Classification Search
CPC .............................. G11C 11/16; G11C 17/02
USPC ......................................................... 257/252
IPC ............................................ G11C 11/16, 17/02
See application file for complete search history.

(56) References Cited

U.S. PATENT DOCUMENTS

| | | | |
|---|---|---|---|
| 6,566,706 B1 * | 5/2003 | Wang | ................ H01L 27/11521 |
| | | | 257/239 |
| 6,958,502 B2 | 10/2005 | Lu | |
| 7,995,378 B2 | 8/2011 | Yoon et al. | |
| 8,164,147 B2 | 4/2012 | Asao | |
| 8,238,145 B2 | 8/2012 | Abedifard | |

(Continued)

FOREIGN PATENT DOCUMENTS

WO 2015047337 A1 4/2015

OTHER PUBLICATIONS

Huda, Safeen, "Modeling and Design of Spin Torque Transfer Magnetoresistive Random Access Memory," Thesis, University of Toronto, 120 pages.

(Continued)

*Primary Examiner* — Andy Huynh
*Assistant Examiner* — Sitaramarao S Yechuri
(74) *Attorney, Agent, or Firm* — Withrow & Terranova, PLLC

(57) ABSTRACT

Shared source line magnetic tunnel junction (MTJ) bit cells employing uniform MTJ connection patterns for reduced area are disclosed. In one aspect, a two (2) transistor, two (2) MTJ (2T2MTJ) bit cell includes a shared source line system having first and second source lines. A uniform MTJ connection pattern results in the first source line disposed in an upper metal layer and electrically coupled to a free layer of a first MTJ, and the second source line disposed in a lower metal layer and electrically coupled to a second access transistor. Middle segments are disposed in middle metal layers to reserve the middle metal layers for strap segments of a strap cell that may be used to electrically couple the first and second source lines. Electrically coupling the first and second source lines using the strap cell allows each MTJ to logically share a single source line.

30 Claims, 9 Drawing Sheets

(56) References Cited

U.S. PATENT DOCUMENTS

| | | | |
|---|---|---|---|
| 8,416,600 B2* | 4/2013 | Lin | G11C 11/16 365/148 |
| 2009/0174016 A1* | 7/2009 | Tanizaki | H01L 27/228 257/421 |
| 2011/0051509 A1* | 3/2011 | Rao | H01L 27/0207 365/171 |
| 2015/0357376 A1* | 12/2015 | Seo | H01L 27/228 257/252 |

OTHER PUBLICATIONS

Co-pending U.S. Appl. No. 14/835,871, filed Aug. 26, 2015.

* cited by examiner

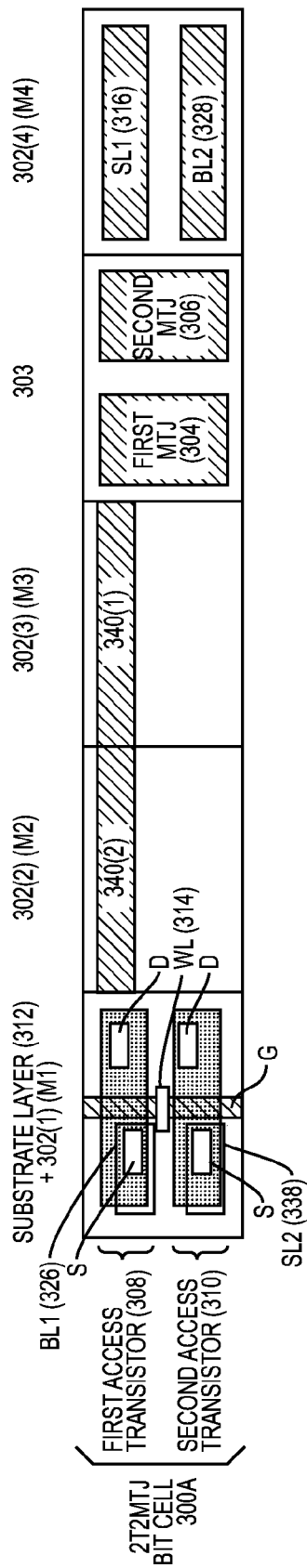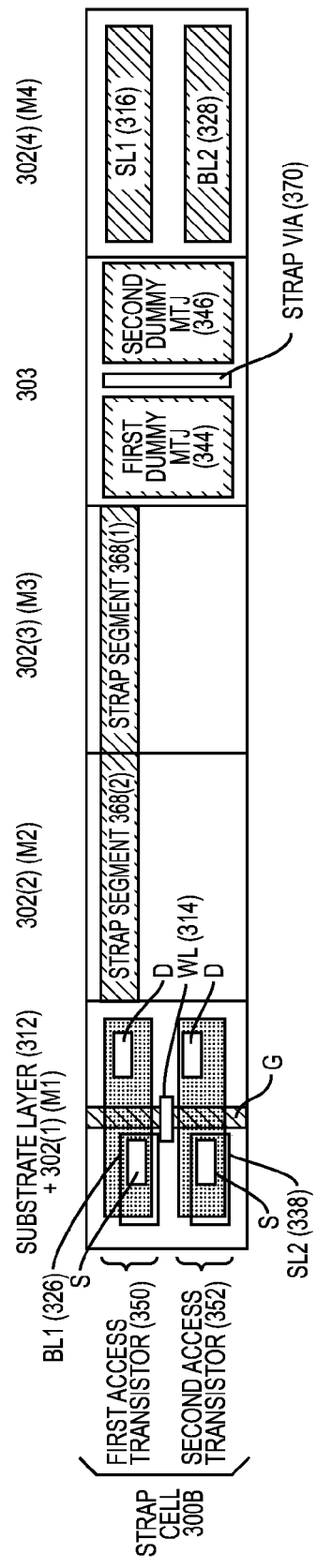

SHARED SOURCE LINE MAGNETIC TUNNEL JUNCTION (MTJ) BIT CELLS EMPLOYING UNIFORM MTJ CONNECTION PATTERNS FOR REDUCED AREA

BACKGROUND

I. Field of the Disclosure

The technology of the disclosure relates generally to magnetic tunnel junctions (MTJs), and particularly to the use of MTJ bit cells in magnetic random access memory (MRAM), including two (2) transistor, two (2) MTJ (2T2MTJ) bit cells.

II. Background

Processor-based computer systems include memory for data storage. Memory systems are composed of resistive memory elements capable of storing data, wherein the form of the stored data depends on the type of memory employed. In particular, magnetic random access memory (MRAM) is an example of non-volatile memory in which data is stored by programming a magnetic tunnel junction (MTJ) of an MRAM bit cell. Data is stored in an MTJ as a magnetic state, wherein no electric current is required to preserve a stored data value. Thus, an MTJ can store data even when power is not supplied to the MTJ (i.e., the MTJ is non-volatile). Conversely, memory that stores data in the form of an electric charge, such as static random access memory (SRAM), requires power to preserve a stored data value (i.e., such memory is volatile). Thus, because an MTJ may store information even when power is turned off, particular circuits and systems may benefit from employing MRAM.

In this regard, FIG. 1 illustrates an exemplary MRAM bit cell 100 that includes a metal oxide semiconductor (MOS) (typically n-type MOS, i.e., NMOS) access transistor 102 integrated with an MTJ 104 for storing non-volatile data. The MRAM bit cell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientation of the pinned layer 106 and the free layer 108 are anti-parallel (AP) to each other, a first memory state exists (e.g., a logical '1'). When the magnetic orientation of the pinned layer 106 and the free layer 108 are parallel (P) to each other, a second memory state exists (e.g., a logical '0'). Further, the access transistor 102 controls reading and writing of data to the MTJ 104. A drain (D) of the access transistor 102 is coupled to a bottom electrode 112 of the MTJ 104, which is coupled to the pinned layer 106. A word line 114 is coupled to a gate (G) of the access transistor 102. A source (S) of the access transistor 102 is coupled to a source line 116. A bit line 118 is coupled to a top electrode 120 of the MTJ 104, which is coupled to the free layer 108.

To read data stored in the MRAM bit cell 100, the resistance (R) of the MRAM bit cell 100 is measured. In particular, the word line 114 activates the access transistor 102 to allow current (I) to flow through the MTJ 104 between the bottom electrode 112 and the top electrode 120. The resistance (R) is measured by dividing a voltage (V) of the bit line 118 by the current (I) flowing between the bottom and top electrodes 112, 120. A lower resistance (R) is associated with a P orientation between the pinned layer 106 and the free layer 108. A higher resistance (R) is associated with an AP orientation between the pinned layer 106 and the free layer 108. Reading the MRAM bit cell 100 in this manner is not immediate, but rather such a read operation requires a certain amount of time to measure the resistance (R). As a non-limiting example, certain MRAM bit cells similar to the MRAM bit cell 100 require approximately five (5) nanoseconds (ns) of read sensing time to perform a read operation. However, certain circuits, such as a level two (L2) cache memory may require a faster read sensing time, such as three (3) ns, for example. Thus, it would be advantageous if MRAM bit cells could be provided that have a reduced read sensing time as compared to the MRAM bit cell 100 in FIG. 1.

In this regard, FIG. 2 illustrates an exemplary two (2) transistor, two (2) MTJ (2T2MTJ) bit cell 200. The 2T2MTJ bit cell 200 achieves a reduced read sensing time as compared to the read sensing time of the one (1) transistor MRAM bit cell 100 in FIG. 1. The 2T2MTJ bit cell 200 includes a first MTJ 202 and a second MTJ 204, wherein a first value stored in the first MTJ 202 is a complement of a second value stored in the second MTJ 204. A first bit line 206 is coupled to a free layer 208 of the first MTJ 202, and a drain (D) of a first access transistor 210 is coupled to a pinned layer 212 of the first MTJ 202. A tunnel barrier 213 is disposed between the free layer 208 and the pinned layer 212. A first source line 214 is coupled to a source (S) of the first access transistor 210. Similarly, a second bit line 216, which is a complement of the first bit line 206, is coupled to a free layer 218 of the second MTJ 204, and a drain (D) of a second access transistor 220 is coupled to a pinned layer 222 of the second MTJ 204. A tunnel bather 223 is disposed between the free layer 218 and the pinned layer 222. A second source line 224 is coupled to a source (S) of the second access transistor 220. A word line 226 is coupled to a gate (G) of the first access transistor 210 and a gate (G) of the second access transistor 220, wherein the first MTJ 202 and the second MTJ 204 are activated in response to the word line 226 transitioning to a logic high '1' state.

With continuing reference to FIG. 2, to read the 2T2MTJ bit cell 200, the word line 226 activates the first and second access transistors 210, 220. A current (I) is generated that flows from the first source line 214 through the first MTJ 202 to the first bit line 206. A current (I) is also generated that flows from the second source line 224 through the second MTJ 204 to the second bit line 216. Rather than measuring the resistance (R) of the first MTJ 202 and the second MTJ 204 similar to reading the MRAM bit cell 100 in FIG. 1, the voltage (V) of the first MTJ 202 and the voltage (V) of the second MTJ 204 are evaluated by a sensing device, such as a differential operational amplifier (not shown). Such a sensing device determines the logical value stored in the first MTJ 202 based on the difference in voltages (V) of the first MTJ 202 and the second MTJ 204. Reading the 2T2MTJ bit cell 200 in this manner has a reduced read sensing time as compared to that of the MRAM bit cell 100 in FIG. 1. However, the additional circuit elements of the 2T2MTJ bit cell 200, such as the second bit line 216 and the second source line 224, may lead to more complex fabrication routing, and thus, higher parasitic resistance. Such higher parasitic resistance may limit the speed of the read sensing time of the 2T2MTJ bit cell 200. Therefore, it would be advantageous to achieve the reduced read sensing time of the 2T2MTJ bit cell 200 in FIG. 2 without being limited by a higher parasitic resistance.

SUMMARY OF THE DISCLOSURE

Aspects disclosed in the detailed description include shared source line magnetic tunnel junction (MTJ) bit cells employing uniform MTJ connection patterns for reduced area. In one aspect, a two (2) transistor, two (2) MTJ (2T2MTJ) bit cell employing a uniform MTJ connection pattern to achieve a layout with reduced area is provided. The 2T2MTJ bit cell includes a first and a second MTJ, wherein a value represented by a magnetic orientation in the first MTJ is a complement of a value represented by a magnetic orientation in the second MTJ. The 2T2MTJ bit cell also includes a first and second access transistor, wherein the first and second access transistors provide access to the first and second MTJs, respectively, in response to a word line. The uniform MTJ connection pattern results in a first bit line disposed in a lower metal layer, wherein the first bit line is electrically coupled to the first access transistor. The uniform MTJ connection pattern also results in a second bit line disposed in an upper metal layer, wherein the second bit line is electrically coupled to a free layer of the second MTJ.

To provide a shared source line, a shared source line system is included in the 2T2MTJ bit cell that includes a first and second source line. The uniform MTJ connection pattern results in the first source line disposed in the upper metal layer, wherein the first source line is electrically coupled to a free layer of the first MTJ. The uniform MTJ connection pattern also results in the second source line disposed in the lower metal layer, wherein the second source line is electrically coupled to the second access transistor. In addition to the first and second source lines, the shared source line system includes one or more middle segments disposed in one or more corresponding middle metal layers of the 2T2MTJ bit cell. The one or more middle segments are disposed so as to reserve the corresponding middle metal layers for one or more strap segments of a strap cell that may be used to electrically couple the first and second source lines. Electrically coupling the first and second source lines using the strap cell allows each MTJ to logically share a single source line, effectively creating one shared source line for the 2T2MTJ bit cell. Because the shared source line system has a larger area as compared to employing the smaller first and second source lines separately, the shared source line system has a reduced parasitic resistance, and thus a reduced read sensing time. Further, due to the uniform MTJ connection pattern, the 2T2MTJ bit cell achieves a reduced read sensing time while limiting increased area consumption, as the uniform MTJ connection pattern provides equal area consumption for both the first and second MTJs.

In this regard in one aspect, an MTJ bit cell is provided. The MTJ bit cell comprises a first access transistor comprising a first electrode electrically coupled to a pinned layer of a first MTJ, a second electrode electrically configured to be coupled to a word line, and a third electrode electrically coupled to a first bit line disposed in a lower metal layer. The MTJ bit cell also comprises a second access transistor comprising a first electrode electrically coupled to a pinned layer of a second MTJ, a second electrode configured to be electrically coupled to the word line, and a third electrode. The MTJ bit cell further comprises a second bit line disposed in an upper metal layer, the second bit line electrically coupled to a free layer of the second MTJ. The MTJ bit cell further comprises a shared source line system. The shared source line system comprises a first source line disposed in the upper metal layer and electrically coupled to a free layer of the first MTJ. The shared source line system further comprises a second source line disposed in the lower metal layer and electrically coupled to the third electrode of the second access transistor. The shared source line system also comprises one or more middle segments disposed in one or more corresponding middle metal layers, wherein the one or more middle segments reserve the one or more corresponding middle metal layers for one or more strap segments of a strap cell configured to electrically couple the first and second source lines.

In another aspect, a strap cell configured to electrically couple a first source line and a second source line of an MTJ bit cell is provided. The strap cell comprises a first access transistor comprising, a first electrode electrically coupled to a pinned layer of a first dummy MTJ, a second electrode, and a third electrode. The strap cell also comprises a second access transistor comprising a first electrode, a second electrode, and a third electrode. The strap cell further comprises a first source line disposed in an upper metal layer and electrically coupled to a free layer of the first dummy MTJ. The strap cell further comprises a second source line disposed in a lower metal layer and electrically coupled to the third electrode of the second access transistor. The strap cell further comprises one or more strap segments disposed in one or more corresponding middle metal layers, wherein the one or more strap segments are configured to electrically couple the first and second source lines.

In another aspect, a method of manufacturing an MTJ bit cell is provided. The method comprises disposing a first access transistor on a substrate layer, disposing a second access transistor on the substrate layer, and disposing a first bit line in a lower metal layer, the first bit line electrically coupled to a third electrode of the first access transistor. The method also comprises disposing a first MTJ below an upper metal layer, disposing a second MTJ below the upper metal layer, and disposing a word line so as to be electrically coupled to a second electrode of the first access transistor and a second electrode of the second access transistor. The method further comprises disposing a second bit line in the upper metal layer, the second bit line electrically coupled to a free layer of the second MTJ. The method also comprises disposing a first source line in the upper metal layer, the first source line electrically coupled to a free layer of the first MTJ. The method also comprises disposing a second source line in the lower metal layer, the second source line electrically coupled to a third electrode of the second access transistor. The method further comprises disposing one or more middle segments in one or more corresponding middle metal layers, wherein the one or more middle segments reserve the one or more corresponding middle metal layers for one or more strap segments of a strap cell configured to electrically couple the first and second source lines.

In another aspect, an MRAM data array is provided. The MRAM data array comprises one or more MTJ columns Each MTJ column of the one or more MTJ columns comprises one or more MTJ rows. Each MTJ row or the one or more MTJ rows comprises a plurality of MTJ bit cells. Each MTJ bit cell of the plurality of MTJ bit cells comprises a first access transistor comprising a first electrode electrically coupled to a pinned layer of a first MTJ, a second electrode electrically configured to be coupled to a word line, and a third electrode electrically coupled to a first bit line disposed in a lower metal layer. Each MTJ bit cell of the plurality of MTJ bit cells also comprises a second access transistor comprising a first electrode electrically coupled to a pinner layer of a second MTJ, a second electrode configured to be electrically coupled to the word line, and a third electrode. Each MTJ bit cell of the plurality of MTJ bit cells also comprises a second bit line disposed in an upper metal layer, the second bit line electrically coupled to a free layer of the second MTJ. Each MTJ bit cell of the plurality of MTJ bit cells further comprises a shared source line system. The shared source line system comprises a first source line disposed in the upper metal layer and electrically coupled to a free layer of the first MTJ and a second source line disposed in the lower metal layer and electrically coupled to the third electrode of the second access transistor. The shared source line system also comprises one or more middle segments disposed in one or more middle metal layers. The one or more middle segments reserve the one or more corresponding middle metal layers for one or more strap segments of a strap cell configured to electrically couple the first and second source lines.

BRIEF DESCRIPTION OF THE FIGURES

FIG. 7A is a top view of metal layers of the 2T2MTJ bit cell in FIG. 3A;

FIG. 7B is a top view of metal layers of the strap cell in FIG. 3B; and

DETAILED DESCRIPTION

Figure 1:
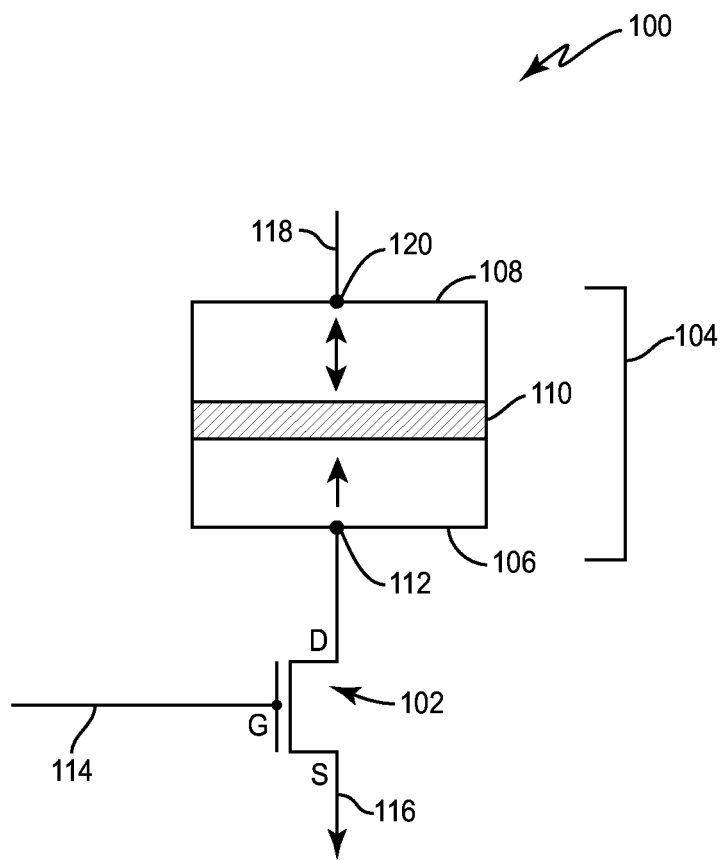
FIG. 1 is a schematic diagram of an exemplary magnetic tunnel junction (MTJ) operatively coupled to a bit line and a source line in the prior art.
Figure 2:
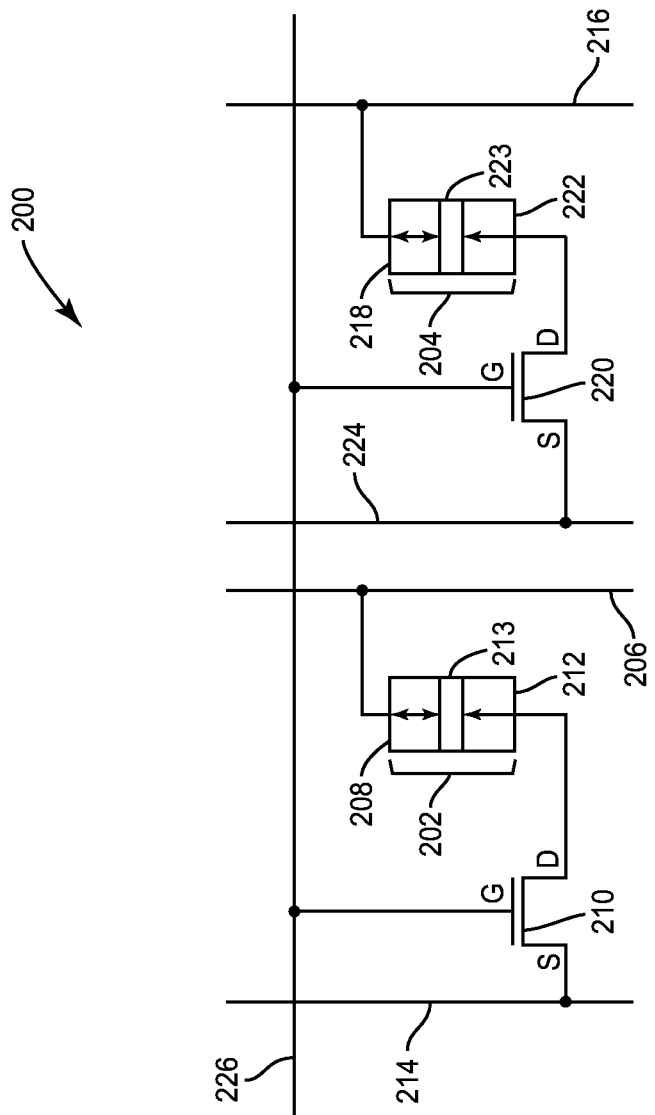
FIG. 2 is schematic diagram of a two (2) transistor, two (2) MTJ (2T2MTJ) bit cell employing two (2) bit lines and two (2) source lines in the prior art.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 3A:
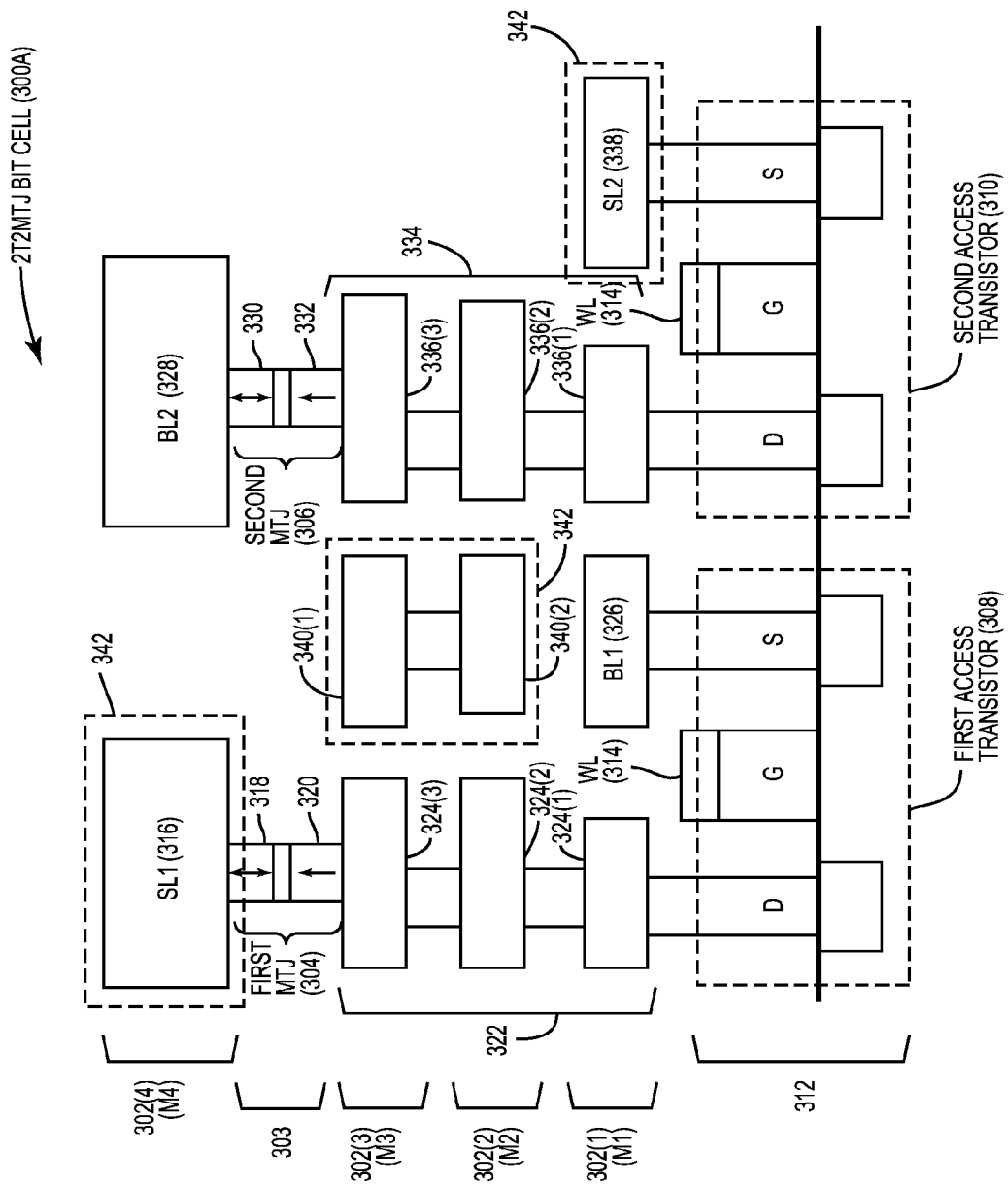
FIG. 3A is a cross-sectional diagram of an exemplary 2T2MTJ bit cell employing a uniform MTJ connection pattern for reduced area.

FIG. 3A is a cross-sectional diagram of an exemplary two (2) transistor, two (2) magnetic tunnel junction (2T2MTJ) bit cell 300A employing a uniform MTJ connection pattern for reduced area. In this aspect, the 2T2MTJ bit cell 300A is formed using multiple metal layers 302(1)-302(4) and an MTJ layer 303. The 2T2MTJ bit cell 300A includes a first MTJ 304 and a second MTJ 306 disposed in the MTJ layer 303 between the metal layers 302(3) and 302(4). The value represented by a magnetic orientation in the first MTJ 304 is a complement of a value represented by a magnetic orientation in the second MTJ 306. The 2T2MTJ bit cell 300A also includes a first access transistor 308 and a second access transistor 310 disposed in a substrate layer 312, wherein the first and second access transistors 308, 310 provide access to the first and second MTJs 304, 306, respectively, in response to a word line 314. The first and second access transistors 308, 310 each include a drain (D) as a first electrode, a gate (G) as a second electrode, and a source (S) as a third electrode. The 2T2MTJ bit cell 300A is designed such that the first MTJ 304 corresponds to a connection pattern wherein a first source line (SL1) 316 is disposed in the upper metal layer 302(4) (metal four (M4) in this example) above the first MTJ 304, and is electrically coupled to a free layer 318 of the first MTJ 304. Further, a pinned layer 320 of the first MTJ 304 is electrically coupled to the first electrode (D) of the first access transistor 308 using a first connection column 322 formed from metal segments 324(1)-324(3) disposed in the corresponding metal layers 302(1)-302(3) (metal one (M1), metal two (M2), and metal three (M3) in this example). The word line 314 is electrically coupled to the second electrode (G) of the first access transistor 308, and a first bit line (BL1) 326 disposed in the lower metal layer 302(1) is electrically coupled to the third electrode (S) of the first access transistor 308.

With continuing reference to FIG. 3A, a similar connection pattern corresponds to the second MTJ 306, wherein a second bit line (BL2) 328 is disposed in the upper metal layer 302(4) (M4) above the second MTJ 306, and is electrically coupled to a free layer 330 of the second MTJ 306. Further, a pinned layer 332 of the second MTJ 306 is electrically coupled to the first electrode (D) of the second access transistor 310 using a second connection column 334 formed from metal segments 336(1)-336(3) disposed in the corresponding metal layers 302(1)-302(3) (M1-M3). The word line 314 is electrically coupled to the second electrode (G) of the second access transistor 310, while a second source line (SL2) 338 is disposed in the lower metal layer 302(1) (M1) and is electrically coupled to the third electrode (S) of the second access transistor 310.

With continuing reference to FIG. 3A, the first and second source lines 316, 338 are combined with middle segments 340(1), 340(2) disposed in the middle metal layers 302(3) (M3), 302(2) (M2), respectively, of the 2T2MTJ bit cell 300A to form a shared source line system 342. As discussed in more detail below in relation to FIG. 3B, the middle segments 340(1), 340(2) are disposed so as to reserve the middle metal layers 302(3) (M3), 302(2) (M2) for strap segments of a strap cell that may be used to electrically couple the first and second source lines 316, 338. Electrically coupling the first and second source lines 316, 338 using a strap cell allows the first and second MTJs 304, 306 to logically share a single source line by effectively creating one shared source line for the 2T2MTJ bit cell 300A. Because the shared source line formed from coupling the first and second source lines 316, 338 has a larger area as compared to employing the first and second source lines 316, 338 separately, the shared source line has a reduced parasitic resistance, and thus a reduced read sensing time. Further, due to the uniform MTJ connection pattern, the 2T2MTJ bit cell 300A achieves reduced read sensing time while limiting area consumption, as the uniform MTJ connection pattern provides equal area consumption for both the first and second MTJs 304, 306.

Figure 3B:
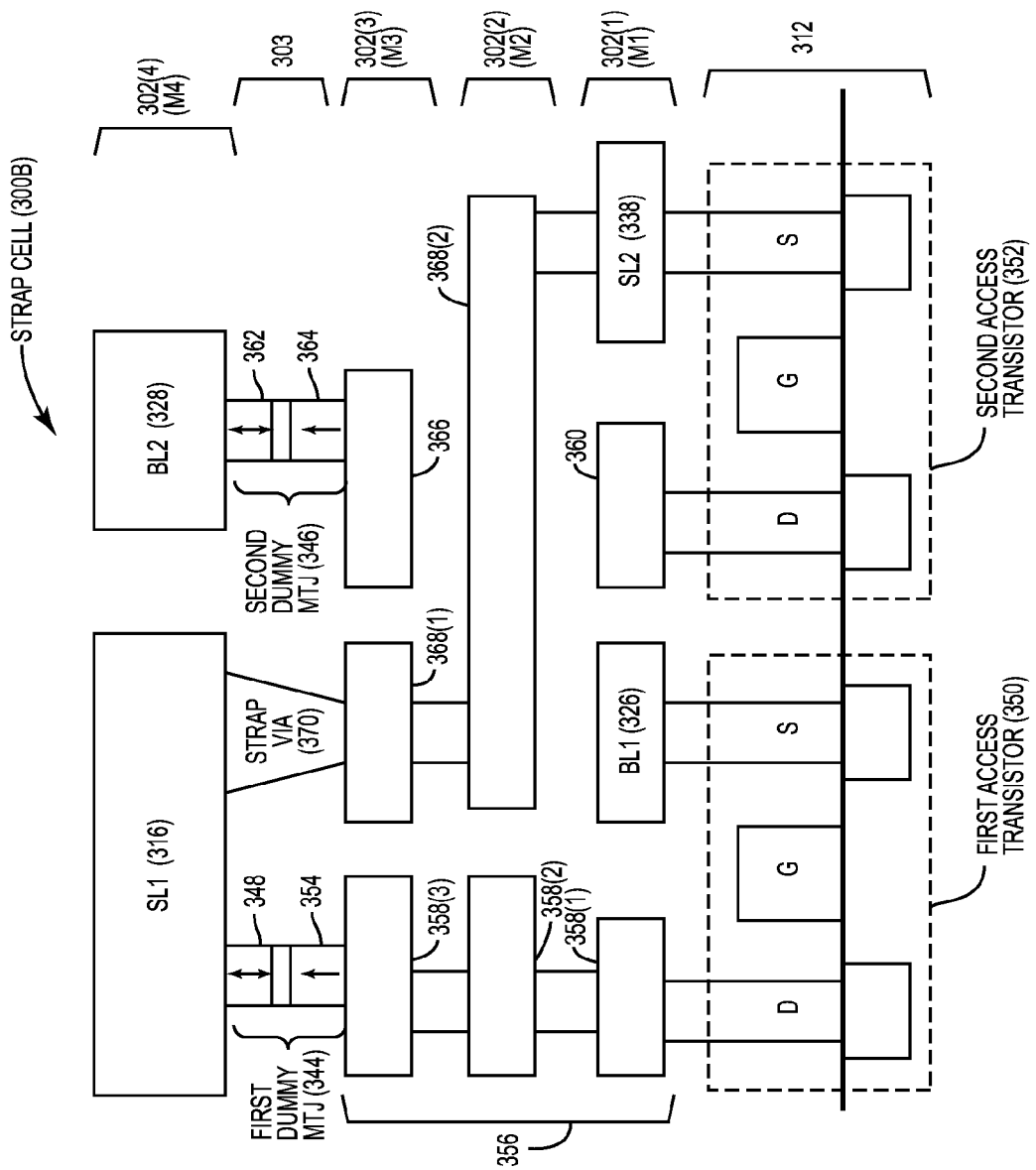
FIG. 3B is a cross-sectional diagram of an exemplary strap cell configured to couple source lines disposed in multiple metal layers in the 2T2MTJ bit cell in FIG. 3A.

As previously mentioned, a strap cell may be used to electrically couple the first and second source lines 316, 338 of the 2T2MTJ bit cell 300A in FIG. 3A so as to provide a logically shared source line. In this regard, FIG. 3B is a cross-sectional diagram of an exemplary strap cell 300B configured to electrically couple the first and second source lines 316, 338 in the 2T2MTJ bit cell 300A in FIG. 3A. Common elements between the strap cell 300B in FIG. 3B and the 2T2MTJ bit cell 300A in FIG. 3A are shown with common element numbers between FIGS. 3A and 3B, and thus will not be re-described herein.

With continuing reference to FIG. 3B, the strap cell 300B includes a first dummy MTJ 344 and a second dummy MTJ 346 disposed in the MTJ layer 303. Notably, the first and second dummy MTJs 344, 346 are used for spacing purposes, and are not used for storing data. The first source line 316 is disposed in the upper metal layer 302(4) (M4) and is electrically coupled to a free layer 348 of the first dummy MTJ 344. The strap cell 300B also includes a first access transistor 350 and a second access transistor 352 disposed in the substrate layer 312. The first and second access transistors 350, 352 each include a drain (D) as a first electrode, a gate (G) as a second electrode, and a source (S) as a third electrode. The first electrode (D) of the first access transistor 350 is electrically coupled to a pinned layer 354 of the first dummy MTJ 344 using a first connection column 356 formed from metal segments 358(1)-358(3) disposed in the corresponding metal layers 302(1)-302(3) (M1-M3). Further, in this aspect, the third electrode (S) of the first access transistor 350 is electrically coupled to the first bit line 326. The first electrode (D) of the second access transistor 352 is electrically coupled to a metal segment 360 in the lower metal layer 302(1) (M1), while the third electrode (S) of the second access transistor 352 is electrically coupled to the second source line 338 disposed in the lower metal layer 302(1) (M1). Further, in this aspect, the second bit line 328 is electrically coupled to a free layer 362 of the second dummy MTJ 346, while a pinned layer 364 of the second dummy MTJ 346 is electrically coupled to a metal segment 366 disposed in the middle metal layer 302(3) (M3). To electrically couple the first and second source lines 316, 338, the strap cell 300B includes first and second strap segments 368(1), 368(2) disposed in the middle metal layers 302(3) (M3), 302(2) (M2), respectively. In this manner, the first strap segment 368(1) electrically couples the first source line 316 to the second strap segment 368(2). In this aspect, a strap via 370 electrically couples the first source line 316 to the first strap segment 368(1). Further, the second strap segment 368(2) is electrically coupled to the second source line 338.

As previously described, electrically coupling the first and second source lines 316, 338 using the strap segments 368(1), 368(2) of the strap cell 300B allows the first and second MTJs 302, 304 of the 2T2MTJ bit cell 300A in FIG. 3A to logically share a single source line by effectively creating one shared source line. Notably, the strap cell 300B can employ the strap segments 368(1), 368(2) without creating an undesired short in the 2T2MTJ bit cell 300A in FIG. 3A because the middle segments 340(1), 340(2) in the 2T2MTJ bit cell 300A reserve space in the layout design for the strap segments 368(1), 368(2). In other words, if the 2T2MTJ bit cell 300A in FIG. 3A employed elements other than the middle segments 340(1), 340(2) in the middle metal layers 302(3) (M3), 302(2) (M2), the strap segments 368(1), 368(2) could not be employed as provided in this aspect to electrically couple the first and second source lines 316, 338. Thus, the strap cell 300B in FIG. 3B works in conjunction with the layout design of the 2T2MTJ bit cell 300A in FIG. 3A to provide a logically shared source line that reduces the read sensing time of the 2T2MTJ bit cell 300A while limiting area consumption, as previously described.

To provide further clarification of the aspects described above, FIG. 4 illustrates a schematic diagram of an exemplary magnetic random access memory (MRAM) data array 400 employing the 2T2MTJ bit cell 300A in FIG. 3A and the strap cell 300B in FIG. 3B. In this manner, the MRAM data array 400 includes MTJ columns 402(1)-402(N), wherein each MTJ column 402(1)-402(N) includes MTJ rows 404(1)-404(M). Common elements between the MRAM data array 400 and the strap cell 300B in FIG. 3B and the 2T2MTJ bit cell 300A in FIG. 3A are shown with common element numbers between FIGS. 3A, 3B, and 4, and thus will not be re-described herein.

Figure 4:
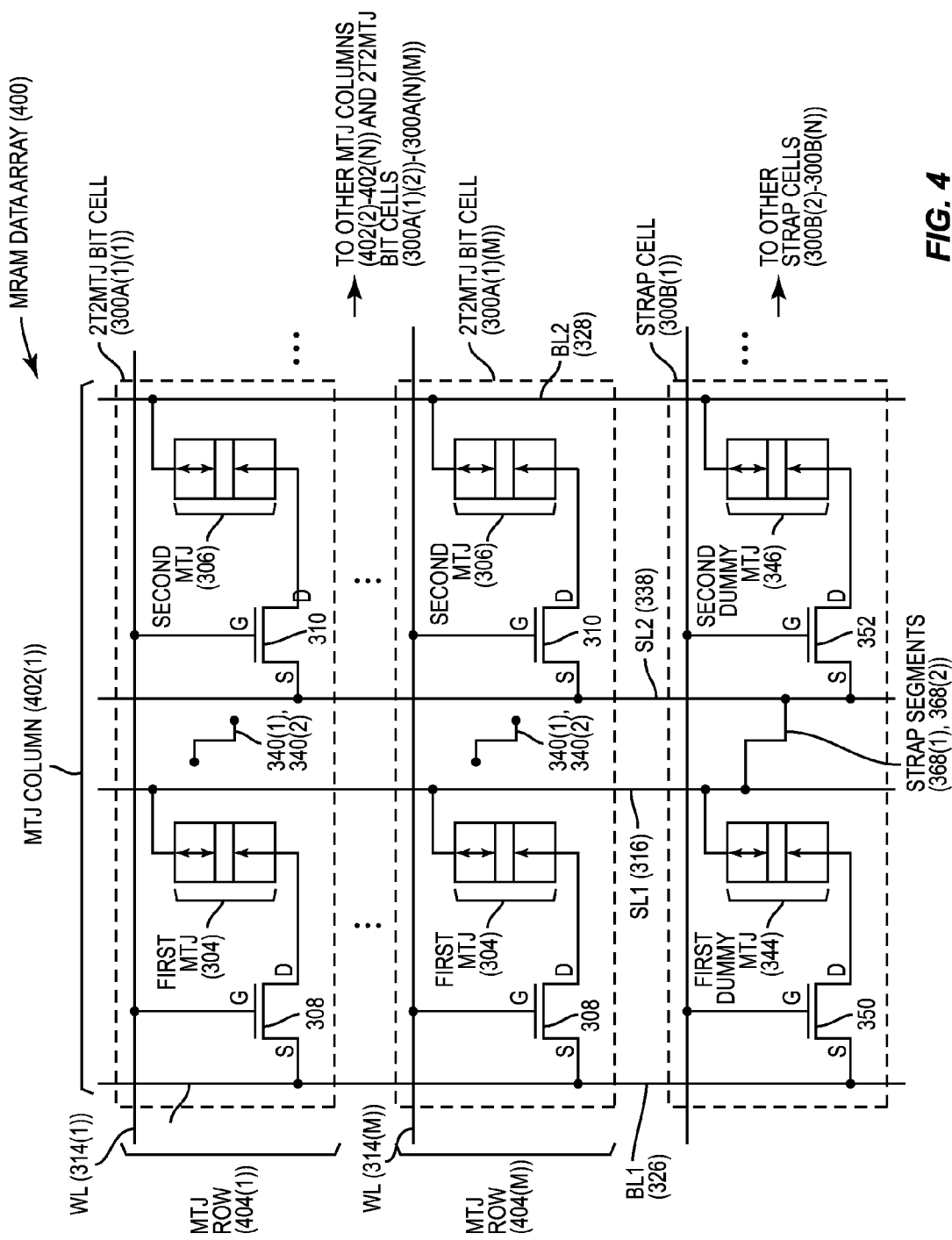
FIG. 4 is a schematic diagram of an exemplary magnetic random access memory (MRAM) data array employing a plurality of 2T2MTJ bit cells and corresponding strap cells.

With continuing reference to FIG. 4, the MRAM data array 400 includes a plurality of 2T2MTJ bit cells 300A(1)(1)-300A(N)(M). In this manner, the 2T2MTJ bit cell 300A(1)(1) is the 2T2MTJ bit cell 300A located in the MTJ row 404(1) of the MTJ column 402(1), and the 2T2MTJ bit cell 300A(N)(M) is the 2T2MTJ bit cell 300A located in the MTJ row 404(M) of the MTJ column 402(N). Further, each of the MTJ columns 402(1)-402(N) includes a corresponding strap cell 300B(1)-300B(N). The strap segments 368(1)-368(2) of each strap cell 300B(1)-300B(N) electrically couple the first source line 316 and the second source line 338 corresponding to the 2T2MTJ bit cells 300A(1)(1)-300A(N)(M) of a corresponding MTJ column 402(1)-402(N). In other words, to achieve the logically shared source line for each MTJ column 402(1)-402(N), the strap cell 300B(1)-300B(N) corresponding to a particular MTJ column 402(1)-402(N) electrically couples the first and second source lines 316, 338. Even though one (1) strap cell 300B is used to couple the first and second source lines 316, 338 of a particular MTJ column 402(1)-402(N), the one (1) strap cell 300B per MTJ column 402(1)-402(N) consumes less area than employing 2T2MTJ bit cells with non-uniform MTJ connection patterns. Thus, as previously described, the uniform MTJ connection pattern and the logically shared source line reduce the read sensing time of the 2T2MTJ bit cell 300A in FIG. 3A while limiting area consumption.

With continuing reference to FIG. 4, n-type metal oxide semiconductor (NMOS) transistors are employed for the first and second access transistors 308, 310 of the 2T2MTJ bit cells 300A(1)(1)-300A(N)(M). In this manner, as previously described, in each of the first and second access transistors 308, 310, the first electrode comprises a drain (D), the second electrode comprises a gate (G), and the third electrode comprises a source (S). Notably, alternative aspects of the 2T2MTJ bit cell 300A may employ p-type metal oxide semiconductor (PMOS) transistors for the first and second access transistors 308, 310 and still achieve the improved read sensing and reduced area consumption previously described. In aspects employing PMOS transistors for the first and second access transistors 308, 310, the first electrode would comprise a source (S), the second electrode would comprise a gate (G), and a third electrode would comprise a drain (D).

With continuing reference to FIG. 4, to read one of the 2T2MTJ bit cells 300A(1)(1)-300A(N)(M), a word line (WL) 314(1)-314(M) corresponding to the MTJ row 404(1)-404(M) having the desired 2T2MTJ bit cell 300A transitions to a logic high '1' state to activate the corresponding first and second access transistors 308, 310. The first bit line 326 is configured to receive a first read voltage ($V_{R1}$), and the second bit line 328 is configured to receive a second read voltage ($V_{R2}$). Additionally, the first and second source lines 316, 338 are configured to receive a source read voltage ($V_{RS}$). Applying the first read voltage ($V_{R1}$) and the source read voltage ($V_{RS}$) causes a first MTJ voltage ($V_{MTJ1}$) across the first MTJ 304. Applying the second read voltage ($V_{R2}$) and the source read voltage ($V_{RS}$) causes a second MTJ voltage ($V_{MTJ2}$) across the second MTJ 306. The first MTJ voltage ($V_{MTJ1}$) and the second MTJ voltage ($V_{MTJ2}$) are provided to a sensing device (not shown) that determines the logical value represented by a magnetic orientation of the first MTJ 304 and of the second MTJ 306. In this manner, an anti-parallel (AP) magnetic orientation represents a logical '1' value, while a parallel (P) magnetic orientation represents a logical '0' value.

With continuing reference to FIG. 4, to write to read one of the 2T2MTJ bit cells 300A(1)(1)-300A(N)(M), the word line 314(1)-314(M) corresponding to the MTJ row 404(1)-404(M) having the desired 2T2MTJ bit cell 300A transitions to a logic high '1' state to activate the corresponding first and second access transistors 308, 310. The first bit line 326 is configured to receive a first write voltage ($V_{W1}$), and the second bit line 328 is configured to receive a second write voltage ($V_{W2}$). Additionally, the first and second source lines 316, 338 are configured to receive a source write voltage ($V_{WS}$). Applying the first write voltage ($V_{W1}$) while applying the shared write voltage ($V_{WS}$) generates a first write current ($I_{W1}$) flowing through the first MTJ 304. Similarly, applying the second write voltage ($V_{W2}$) and the shared write voltage ($V_{WS}$) generates a second write current ($I_{W2}$) flowing through the second MTJ 306. The strength of the first write current ($I_{W1}$) determines the magnetic orientation of the first MTJ 304, while the second write current ($I_{W2}$) determines the magnetic orientation of the second MTJ 306, wherein the magnetic orientations of the first and second MTJs 304, 306 are indicative of the value written to the 2T2MTJ bit cell 300A.

Figure 5A:
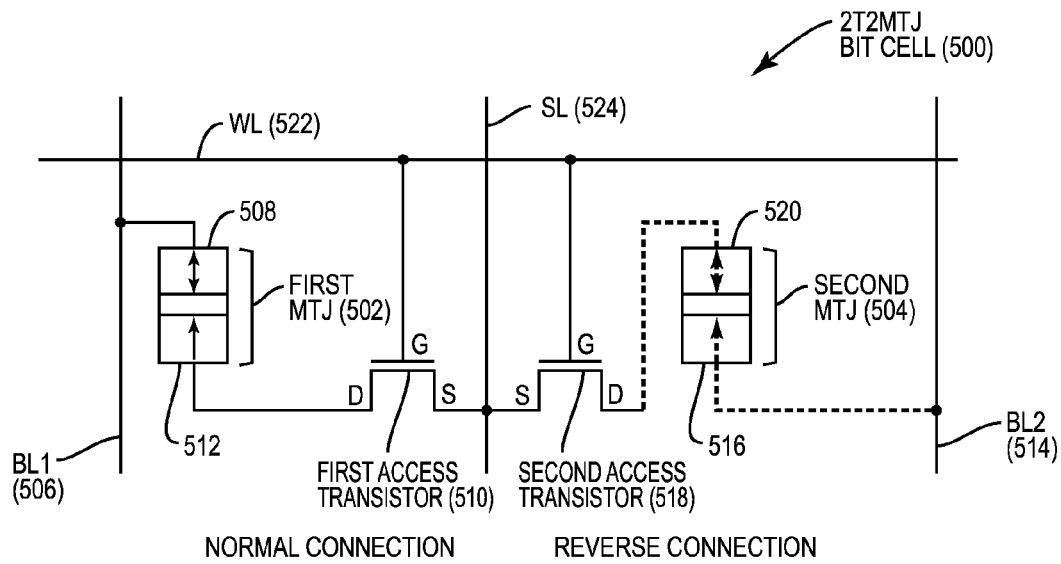
FIG. 5A is a schematic diagram of another exemplary 2T2MTJ bit cell employing a non-uniform MTJ connection pattern and a shared source line.

To better illustrate the reduced area consumption achieved by the 2T2MTJ bit cell 300A in FIGS. 3A and 4, a contrasting 2T2MTJ bit cell structure is now provided. In this regard, FIG. 5A illustrates a schematic diagram of a shared source line 2T2MTJ bit cell 500 (also referred to as the "2T2MTJ bit cell 500") employing a non-uniform MTJ connection pattern. The 2T2MTJ bit cell 500 includes a first MTJ 502 and a second MTJ 504. A first bit line (BL1) 506 is electrically coupled to a free layer 508 of the first MTJ 502, and a first electrode (D) of a first access transistor 510 is coupled to a pinned layer 512 of the first MTJ 502. Notably, a second bit line (BL2) 514 is coupled to a pinned layer 516 of the second MTJ 504, and a first electrode (D) of a second access transistor 518 is coupled to a free layer 520 of the second MTJ 504. In this manner, the second MTJ 504 is coupled to the second bit line 514 and the second access transistor 518 in a reverse manner (i.e., a "reverse connection") as compared to how the first MTJ 502 is coupled to the first bit line 506 and the first access transistor 510 (i.e., a "normal connection"). A word line (WL) 522 is coupled to a second electrode (G) of the first access transistor 510 and a second electrode (G) of the second access transistor 518. Further, a shared source line (SL) 524 is coupled to a third electrode (S) of the first access transistor 510 and a third electrode (S) of the second access transistor 518. Thus, rather than employing separate source lines, the first MTJ 502 and the second MTJ 504 share the shared source line 524. Employing the shared source line 524 in this manner is another option to achieve reduced parasitic resistance, and thus, a reduced read sensing time.

Figure 5B:
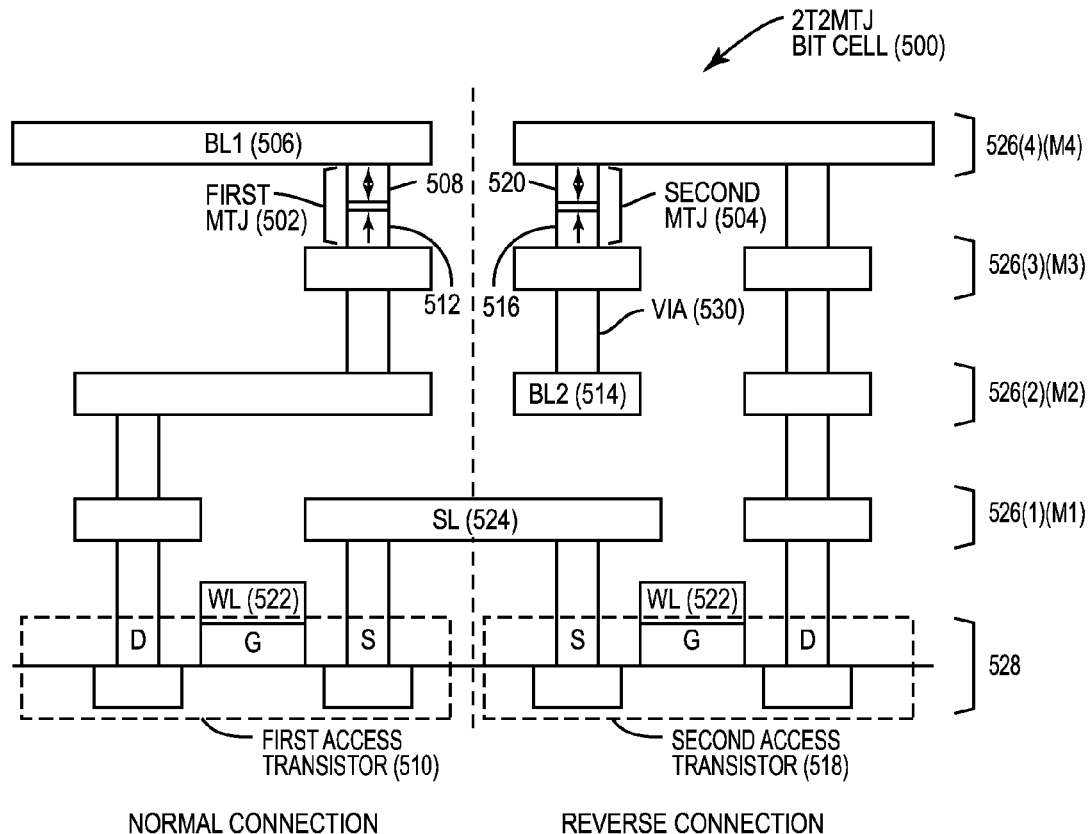
FIG. 5B is a cross-sectional diagram of the 2T2MTJ bit cell in FIG. 5A employing the non-uniform MTJ connection pattern and the shared source line.

Although the 2T2MTJ bit cell 500 in FIG. 5A achieves a reduced read sensing time, the 2T2MTJ bit cell 500 consumes more area as compared to the 2T2MTJ bit cell 300A in FIG. 3A. To provide a clearer comparison of the area consumption of the 2T2MTJ bit cell 500 in FIG. 5A versus the 2T2MTJ bit cell 300A in FIG. 3A, FIG. 5B illustrates a cross-sectional diagram of the 2T2MTJ bit cell 500 in FIG. 5A disposed in metal layers 526(1)-526(4). The first and second access transistors 510, 518 are disposed in a substrate layer 528. The shared source line (SL) 524 is disposed in the metal layer 526(1) (M1) so as to be electrically coupled to the third electrode (S) of the first access transistor 510 and the third electrode (S) of the second access transistor 518. To connect the first MTJ 502 using the normal connection, the first bit line 506 is disposed in the metal layer 526(4) (M4) and is electrically coupled to the free layer 508 of the first MTJ 502. Further, the pinned layer 512 of the first MTJ 502 is electrically coupled to the first electrode (D) of the first access transistor 510. Notably, the area consumption of the first and second MTJs 304, 306 in the 2T2MTJ bit cell 300A in FIG. 3A is similar to the area consumption of the normal connection in the 2T2MTJ bit cell 500 in FIG. 5B.

With continuing reference to FIG. 5B, as previously described, the 2T2MTJ bit cell 500 employs a non-uniform MTJ connection pattern, as opposed to the uniform MTJ connection pattern of the 2T2MTJ bit cell 300A in FIG. 3A. In this manner, because the second MTJ 504 employs the reverse connection instead of the normal connection of the first MTJ 502, the free layer 520 of the second MTJ 504 is electrically coupled to the first electrode (D) of the second access transistor 518. Further, the second bit line 514 is disposed in the metal layer 526(2) (M2) and is electrically coupled to the pinned layer 516 of the second MTJ 504. Notably, a via 530 is employed to couple the second bit line 514 to the pinned layer 516, wherein such a via is not used in the normal connection of the first MTJ 502. The area consumed by the via 530 results in the reverse connection consuming more area than the normal connection of the first MTJ 502. Thus, because the area consumption of the first and second MTJs 304, 306 in FIG. 3A is similar to the area consumption of the normal connection described in FIG. 5B, the 2T2MTJ bit cell 300A in FIG. 3A consumes less area than the 2T2MTJ bit cell 500 in FIG. 5B.

Figure 6:
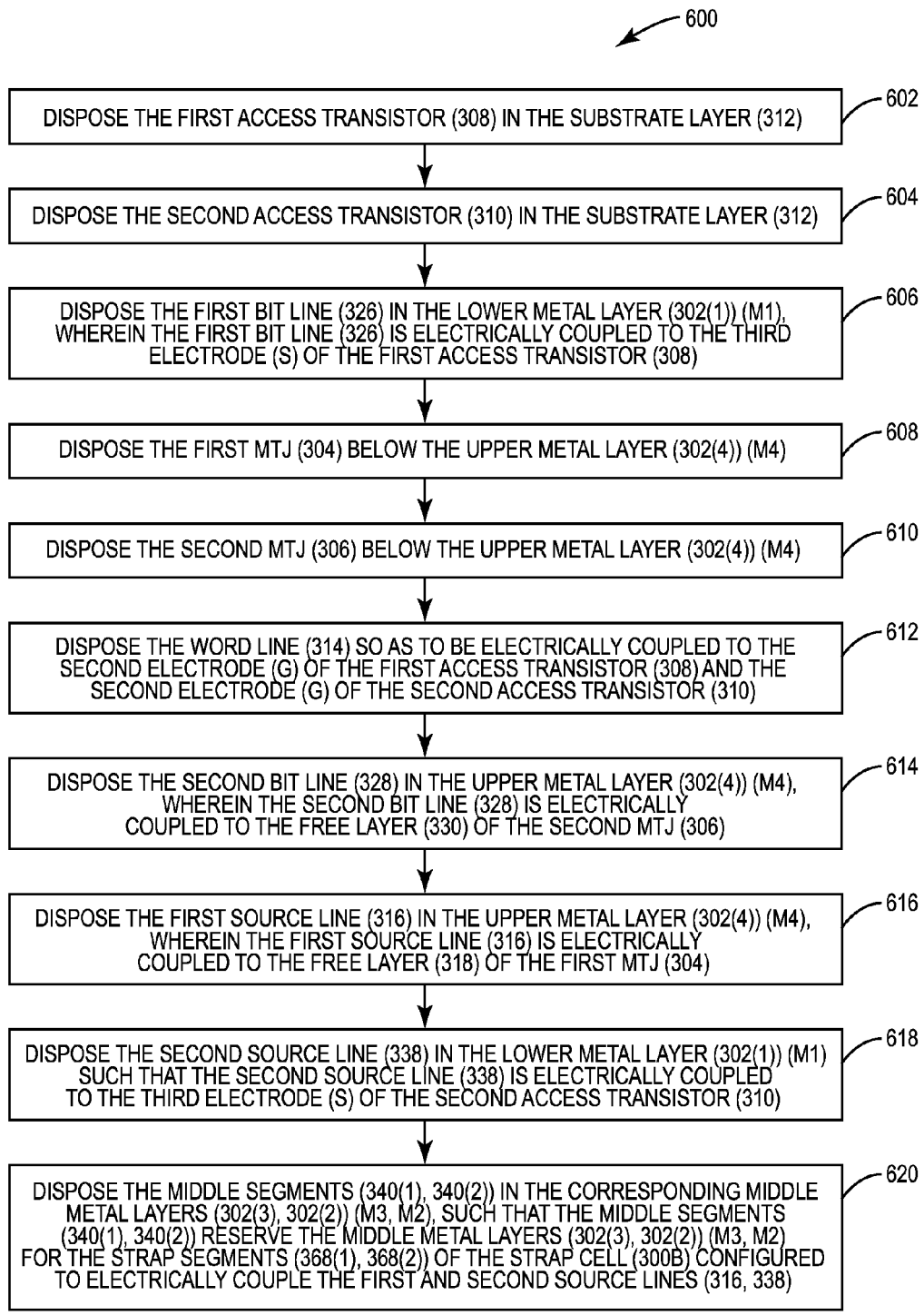
FIG. 6 is a flowchart illustrating an exemplary process for manufacturing the 2T2MTJ bit cell employing the uniform MTJ connection pattern in FIG. 3A.

With the area consumption and read sensing time advantages of the 2T2MTJ bit cell 300A of FIG. 3A provided above, details of manufacturing the 2T2MTJ bit cell 300A are now described. In this manner, FIG. 6 illustrates an exemplary process 600 for manufacturing the 2T2MTJ bit cell 300A in FIG. 3A employing the uniform MTJ connection pattern. The process 600 includes disposing the first access transistor 308 in the substrate layer 312 (block 602). The process 600 also includes disposing the second access transistor 310 in the substrate layer 312 (block 604). The process 600 further includes disposing the first bit line 326 in the lower metal layer 302(1) (M1), wherein the first bit line 326 is electrically coupled to the third electrode (S) of the first access transistor 308 (block 606). Additionally, the process 600 includes disposing the first MTJ 304 below the upper metal layer 302(4) (M4) (block 608). The process 600 also includes disposing the second MTJ 306 below the upper metal layer 302(4) (M4) (block 610). Further, the process 600 includes disposing the word line 314 so as to be electrically coupled to the second electrode (G) of the first access transistor 308 and the second electrode (G) of the second access transistor 310 (block 612).

With continuing reference to FIG. 6, the process 600 also includes disposing the second bit line 328 in the upper metal layer 302(4) (M4), wherein the second bit line 328 is electrically coupled to the free layer 330 of the second MTJ 306 (block 614). Additionally, the process 600 includes disposing the first source line 316 in the upper metal layer 302(4) (M4), wherein the first source line 316 is electrically coupled to the free layer 318 of the first MTJ 304 (block 616). The process 600 also includes disposing the second source line 338 in the lower metal layer 302(1) (M1) such that the second source line 338 is electrically coupled to the third electrode (S) of the second access transistor 310 (block 618). Further, the process 600 includes disposing the middle segments 340(1), 340(2) in the corresponding middle metal layers 302(3), 302(2) (M3, M2), such that the middle segments 340(1), 340(2) reserve the middle metal layers 302(3), 302(2) (M3, M2) for the strap segments 368(1), 368(2) of the strap cell 300B configured to electrically couple the first and second source lines 316, 338 (block 620). In this manner, the process 600 provides the 2T2MTJ bit cell 300A with the uniform MTJ connection pattern and the logically shared source line such that the read sensing time of the 2T2MTJ bit cell 300A is reduced while limiting area consumption.

To provide additional clarification of the layout design of aspects described herein, FIG. 7A illustrates a top view of the 2T2MTJ bit cell 300A in FIG. 3A, and FIG. 7B illustrates a top view of the strap cell 300B in FIG. 3B. In this manner, FIGS. 7A and 7B show the elements disposed at each of the metal layers 302(1)-302(4) (M1-M4) of the 2T2MTJ bit cell 300A and the strap cell 300B, respectively. Because FIGS. 7A and 7B include the same elements with common element numbers as described in FIGS. 3A and 3B, respectively, such elements are not re-described herein.

The shared source line MTJ bit cells employing uniform MTJ connection patterns for reduced area according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
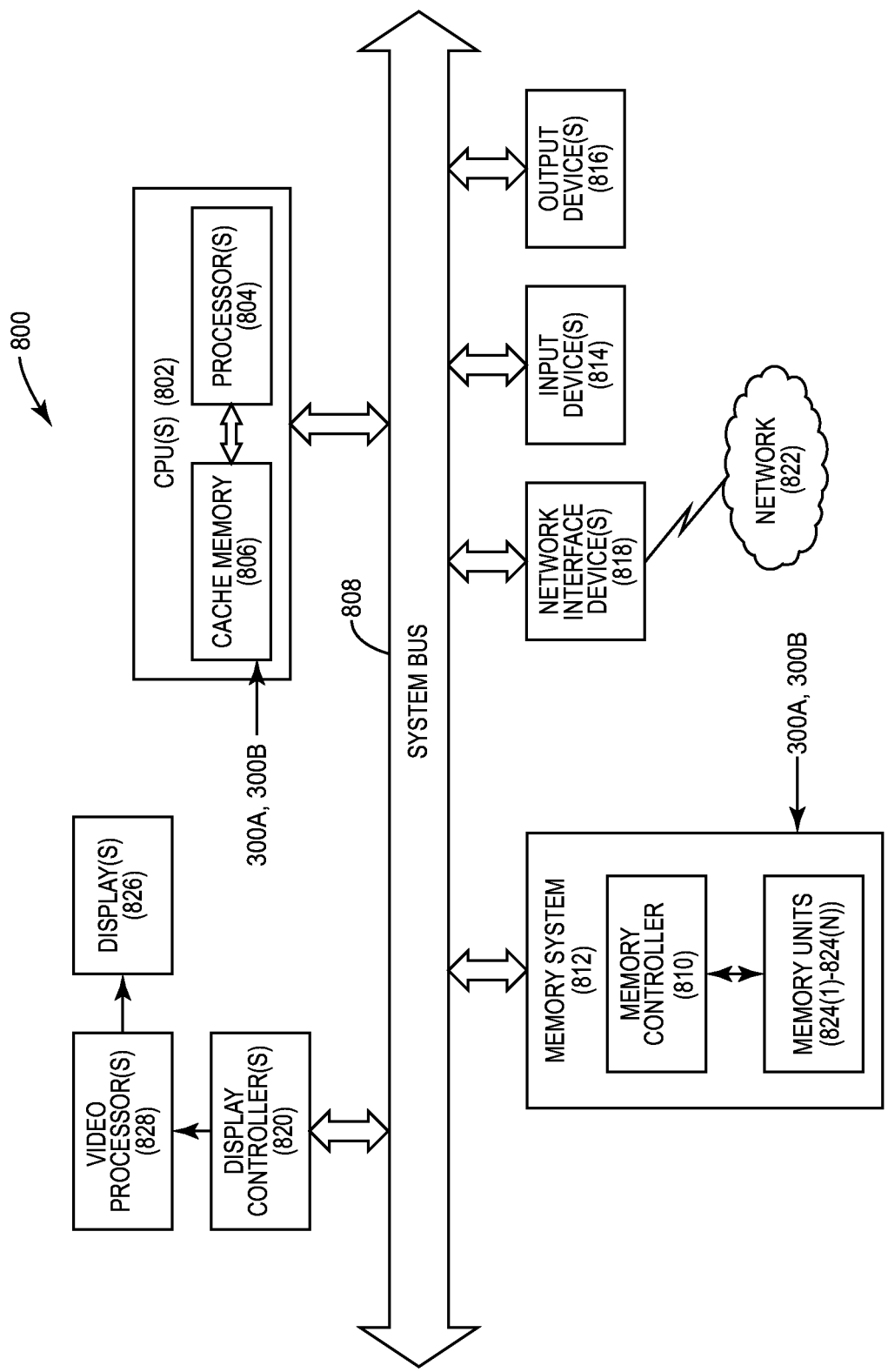
FIG. 8 is a block diagram of an exemplary processor-based system that can include the 2T2MTJ bit cell employing the uniform MTJ connection pattern in FIG. 3A in conjunction with the strap cell in FIG. 3B.

In this regard, FIG. 8 illustrates an example of a processor-based system 800 that can employ a memory that employs the 2T2MTJ bit cell 300A and the strap cell 300B illustrated in FIGS. 3A and 3B. In this example, the processor-based system 800 includes one or more central processing units (CPUs) 802, each including one or more processors 804. The CPU(s) 802 may be a master device. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(1)-824(N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic tunnel junction (MTJ) bit cell, comprising:
    a first access transistor comprising a first electrode electrically coupled to a pinned layer of a first MTJ, a second electrode configured to be electrically coupled to a word line, and a third electrode electrically coupled to a first bit line disposed in a lower metal layer;
    a second access transistor comprising a first electrode electrically coupled to a pinned layer of a second MTJ, a second electrode configured to be electrically coupled to the word line, and a third electrode;
    a second bit line disposed in an upper metal layer, the second bit line electrically coupled to a free layer of the second MTJ; and
    a shared source line system, comprising:
        a first source line disposed in the upper metal layer and electrically coupled to a free layer of the first MTJ;
        a second source line disposed in the lower metal layer and electrically coupled to the third electrode of the second access transistor; and
        one or more middle segments disposed in one or more corresponding middle metal layers, wherein the one or more middle segments reserve the one or more corresponding middle metal layers for one or more strap segments of a strap cell configured to electrically couple the first and second source lines.

2. The MTJ bit cell of claim 1, wherein the MTJ bit cell comprises a two (2) transistor, two (2) MTJ (2T2MTJ) bit cell.

3. The MTJ bit cell of claim 1, wherein the lower metal layer is comprised of metal one (M1).

4. The MTJ bit cell of claim 1, wherein one of the one or more middle metal layers is comprised of metal two (M2).

5. The MTJ bit cell of claim 1, wherein one of the one or more middle metal layers is comprised of metal three (M3).

6. The MTJ bit cell of claim 1, wherein the upper metal layer is comprised of metal four (M4).

7. The MTJ bit cell of claim 1, wherein:
    the first bit line is configured to receive a first read voltage;
    the second bit line is configured to receive a second read voltage; and
    the first source line and the second source line are each configured to receive a source read voltage.

8. The MTJ bit cell of claim 1, wherein:
    the first bit line is configured to receive a first write voltage;
    the second bit line is configured to receive a second write voltage; and
    the first source line and the second source line are each configured to receive a source write voltage.

9. The MTJ bit cell of claim 1, wherein the first access transistor comprises an n-type metal oxide semiconductor (NMOS) transistor, and wherein:
    the first electrode of the first access transistor comprises a drain;
    the second electrode of the first access transistor comprises a gate; and
    the third electrode of the first access transistor comprises a source.

10. The MTJ bit cell of claim 1, wherein the second access transistor comprises an n-type metal oxide semiconductor (NMOS) transistor, and wherein:
    the first electrode of the second access transistor comprises a drain;
    the second electrode of the second access transistor comprises a gate; and
    the third electrode of the second access transistor comprises a source.

11. The MTJ bit cell of claim 1, wherein the first access transistor comprises a p-type metal oxide semiconductor (PMOS) transistor, and wherein:
    the first electrode of the first access transistor comprises a source;
    the second electrode of the first access transistor comprises a gate; and
    the third electrode of the first access transistor comprises a drain.

12. The MTJ bit cell of claim 1, wherein the second access transistor comprises a p-type metal oxide semiconductor (PMOS) transistor, and wherein:
    the first electrode of the second access transistor comprises a source;
    the second electrode of the second access transistor comprises a gate; and
    the third electrode of the second access transistor comprises a drain.

13. The MTJ bit cell of claim 1 integrated into an integrated circuit (IC).

14. The MTJ bit cell of claim 1 integrated into a device selected from the group consisting of: a set top box; an entertainment unit; a navigation device; a communications device; a fixed location data unit; a mobile location data unit;

a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

15. A strap cell configured to electrically couple a first source line and a second source line of a magnetic tunnel junction (MTJ) bit cell, the strap cell comprising:
   a first access transistor comprising a first electrode electrically coupled to a pinned layer of a first dummy MTJ, a second electrode, and a third electrode;
   a second access transistor comprising a first electrode, a second electrode, and a third electrode;
   a first source line disposed in an upper metal layer and electrically coupled to a free layer of the first dummy MTJ;
   a second source line disposed in a lower metal layer and electrically coupled to the third electrode of the second access transistor; and
   one or more strap segments disposed in one or more corresponding middle metal layers, wherein the one or more strap segments are configured to electrically couple the first and second source lines.

16. The strap cell of claim 15, further comprising:
   a first strap segment of the one or more strap segments that electrically couples the first source line to a second strap segment of the one or more strap segments, wherein the second strap segment is electrically coupled to the second source line; and
   a strap via that electrically couples the first source line to the first strap segment of the one or more strap segments.

17. A method of manufacturing a magnetic tunnel junction (MTJ) bit cell, comprising:
   disposing a first access transistor on a substrate layer, wherein the first access transistor comprises a first electrode;
   disposing a second access transistor on the substrate layer, wherein the second access transistor comprises a first electrode;
   disposing a first bit line in a lower metal layer, the first bit line electrically coupled to a third electrode of the first access transistor;
   disposing a first MTJ below an upper metal layer;
   disposing a second MTJ below the upper metal layer;
   disposing a word line so as to be electrically coupled to a second electrode of the first access transistor and a second electrode of the second access transistor;
   disposing a second bit line in the upper metal layer, the second bit line electrically coupled to a free layer of the second MTJ;
   disposing a first source line in the upper metal layer, the first source line electrically coupled to a free layer of the first MTJ;
   disposing a second source line in the lower metal layer, the second source line electrically coupled to a third electrode of the second access transistor; and
   disposing one or more middle segments in one or more corresponding middle metal layers, wherein the one or more middle segments reserve the one or more corresponding middle metal layers for one or more strap segments of a strap cell configured to electrically couple the first and second source lines.

18. The method of claim 17, wherein disposing the second source line in the lower metal layer comprises disposing the second source line in metal one (M1).

19. The method of claim 17, wherein disposing the one or more middle segments in the one or more corresponding middle metal layers comprises disposing one of the one or more middle segments in metal two (M2).

20. The method of claim 17, wherein disposing the one or more middle segments in the one or more corresponding middle metal layers comprises disposing one of the one or more middle segments in metal three (M3).

21. The method of claim 17, wherein disposing the first source line in the upper metal layer comprises disposing the first source line in metal four (M4).

22. A magnetic random access memory (MRAM) data array, comprising:
   one or more magnetic tunnel junction (MTJ) columns, each MTJ column of the one or more MTJ columns comprising:
      one or more MTJ rows, each MTJ row of the one or more MTJ rows comprising:
         a plurality of MTJ bit cells, wherein each MTJ bit cell of the plurality of MTJ bit cells comprises:
            a first access transistor comprising a first electrode electrically coupled to a pinned layer of a first MTJ, a second electrode configured to be electrically coupled to a word line, and a third electrode electrically coupled to a first bit line disposed in a lower metal layer;
            a second access transistor comprising a first electrode electrically coupled to a pinned layer of a second MTJ, a second electrode configured to be electrically coupled to the word line, and a third electrode;
            a second bit line disposed in an upper metal layer, the second bit line electrically coupled to a free layer of the second MTJ; and
            a shared source line system, comprising:
               a first source line disposed in the upper metal layer and electrically coupled to a free layer of the first MTJ;
               a second source line disposed in the lower metal layer and electrically coupled to the third electrode of the second access transistor; and
               one or more middle segments disposed in one or more corresponding middle metal layers, wherein the one or more middle segments reserve the one or more corresponding middle metal layers for one or more strap segments of a strap cell configured to electrically couple the first and second source lines.

23. The MRAM data array of claim 22, wherein each MTJ column of the one or more MTJ columns comprises the strap cell, comprising:
   a first access transistor comprising a first electrode electrically coupled to a pinned layer of a first dummy MTJ, a second electrode, and a third electrode;
   a second access transistor comprising a first electrode, a second electrode, and a third electrode;
   a first source line disposed in the upper metal layer and electrically coupled to a free layer of the first dummy MTJ;
   a second source line disposed in the lower metal layer and electrically coupled to the third electrode of the second access transistor; and
   the one or more strap segments disposed in the one or more corresponding middle metal layers, wherein the one or more strap segments are configured to electrically couple the first and second source lines.

24. The MRAM data array of claim 22, wherein the strap cell comprises:
a first strap segment of the one or more strap segments that electrically couples the first source line to a second strap segment of the one or more strap segments, wherein the second strap segment is electrically coupled to the second source line; and
a strap via that electrically couples the first source line to the first strap segment of the one or more strap segments.

25. The MRAM data array of claim 22, wherein the lower metal layer is comprised of metal one (M1).

26. The MRAM data array of claim 22, wherein one middle metal layer of the one or more middle metal layers is comprised of metal two (M2).

27. The MRAM data array of claim 22, wherein one middle metal layer of the one or more middle metal layers is comprised of metal three (M3).

28. The MRAM data array of claim 22, wherein the upper metal layer is comprised of metal four (M4).

29. The MRAM data array of claim 22 integrated into an integrated circuit (IC).

30. The MRAM data array of claim 22 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *